(12) United States Patent
Kim et al.

(10) Patent No.: US 12,256,478 B2
(45) Date of Patent: Mar. 18, 2025

(54) COOKING APPARATUS

(71) Applicant: LG Electronics Inc., Seoul (KR)

(72) Inventors: Eui Sung Kim, Seoul (KR);
Yangkyeong Kim, Seoul (KR);
Hyunwook Moon, Seoul (KR)

(73) Assignee: LG Electronics Inc., Seoul (KR)

( * ) Notice: Subject to any disclaimer, the term of this patent is extended or adjusted under 35 U.S.C. 154(b) by 1077 days.

(21) Appl. No.: 16/769,199

(22) PCT Filed: Jan. 9, 2019

(86) PCT No.: PCT/KR2019/000358
§ 371 (c)(1),
(2) Date: Oct. 6, 2021

(87) PCT Pub. No.: WO2019/156372
PCT Pub. Date: Aug. 15, 2019

(65) Prior Publication Data
US 2022/0039218 A1 Feb. 3, 2022

(30) Foreign Application Priority Data
Feb. 8, 2018 (KR) .................. 10-2018-0015456

(51) Int. Cl.
*H05B 6/12* (2006.01)
*H01R 25/14* (2006.01)
(Continued)

(52) U.S. Cl.
CPC .......... *H05B 6/1236* (2013.01); *H01R 25/14* (2013.01); *H05B 6/04* (2013.01); *H05B 6/062* (2013.01);
(Continued)

(58) Field of Classification Search
CPC ........ H05B 6/04; H05B 6/062; H05B 6/1236; H05K 9/0075; H05K 9/00
See application file for complete search history.

(56) References Cited

U.S. PATENT DOCUMENTS 2,738,723 A * 3/1956 Jennett ................ A47J 37/0623
219/486
3,989,916 A 11/1976 Amagami et al.
(Continued)

FOREIGN PATENT DOCUMENTS

EP 2931006 10/2015
JP 2006230516 9/2006
(Continued)

OTHER PUBLICATIONS

Extended European Search Report in European Appln. No. 19750278.4, dated Oct. 7, 2021, 5 pages.

*Primary Examiner* — Thien S Tran
(74) *Attorney, Agent, or Firm* — Fish & Richardson P.C.

(57) ABSTRACT

The present disclosure relates to a cooking apparatus having a heating module capable of moving in a two-dimensional space and, particularly, to a cooking apparatus comprising: an upper plate configured to support a cooking vessel, a heating module disposed movably in a space provided under the upper plate and included a coil, and a rail disposed under the heating module to guide movements of the heating module, wherein electric current is supplied to the rail and the heating module supplies an alternating current through the rail. According to the present disclosure, the heating module supplies a current through the rail rather than receiving a current through a separate connection coil or wiring from an external power supply, thereby enabling shorting or disconnection of a current to be prevented even if the heating module moves.

19 Claims, 4 Drawing Sheets

(51) Int. Cl.
    *H05B 6/04*          (2006.01)
    *H05B 6/06*          (2006.01)
    *H05K 9/00*          (2006.01)

(52) U.S. Cl.
    CPC ......... *H05K 9/0075* (2013.01); *H05B 6/1245* (2013.01); *H05B 2206/022* (2013.01)

(56) References Cited

U.S. PATENT DOCUMENTS

2010/0315038 A1    12/2010   Terao et al.
2012/0223070 A1*   9/2012   Matsui ................. H05B 6/1263
                                                                                        219/677

FOREIGN PATENT DOCUMENTS

| | | | | |
|---|---|---|---|---|
| JP | 2006230516 A | * | 9/2006 | ............ F24C 15/103 |
| JP | 2009011400 | | 1/2009 | |
| JP | 2011004474 | | 1/2011 | |
| KR | 100595280 | | 3/2006 | |
| KR | 20100010249 | | 2/2010 | |
| KR | 20130111005 | | 10/2013 | |
| KR | 20170127097 | | 11/2017 | |
| WO | WO-2017178217 A1 | * | 10/2019 | |

\* cited by examiner

COOKING APPARATUS

TECHNICAL FIELD

The present disclosure relates to a cooking apparatus, and, particularly, to a cooking apparatus that can change a position of a heating module for heating a cooking vessel.

BACKGROUND

Cooking apparatuses may heat food using electricity or other energy sources (e.g., gas) at homes or in indoor spaces.

The cooking apparatuses may be classified as a cooking apparatus such as a gas range, a gas oven, or a gas oven range, and the like that use gas as a heat source, a cooking apparatus such as an induction range that uses electricity as a heat source, an electric range using a radiant heater, a microwave oven, and the like. In some cases, a cooking apparatus may include an induction range using electricity and a gas oven using gas that are combined.

An induction range may use induction heating (IH). Induction heating involves a technology of enabling induced current to flow without directly contacting an object subject to heating. For example, induction heating may include a technology or method for generating heat in a cooking vessel disposed in a magnetic field space using a magnetic field that is formed around a coil when electric current is supplied to the coil. In induction heating, the cooking vessel may be made of a material to which a magnet is attached (e.g., a metallic material to which a magnet is attached).

In some cases, a cooking apparatus may include a coil for heating a cooking vessel at a predetermined position of the cooking apparatus.

SUMMARY

The present disclosure describes a cooking apparatus that may heat a cooking vessel even when the cooking vessel is disposed at any position on the cooking apparatus.

The present disclosure also describes a cooking apparatus that may move a heating module provided at the cooking apparatus in a lengthwise direction and a widthwise direction of the cooking apparatus.

The present disclosure further describes a cooking apparatus that may supply electric current stably to the heating module without interruption of supply of current or disconnection of current even when the heating module provided at the cooking apparatus is moved.

According to one aspect of the subject matter described in this application, a cooking apparatus includes an upper plate configured to support a cooking vessel, a heating module that is disposed in a lower space defined vertically below the upper plate and that is configured to move in the lower space relative to the upper plate, the heating module comprising a coil, and a rail that is disposed vertically below the heating module, that is configured to guide movement of the heating module, and that is configured to receive electric current and transmit the electric current to the heating module.

Implementations according to this aspect may include one or more of the following features. For example, the rail may include a first rail that supports the heating module and that is electrically connected to the heating module, and the heating module may be configured to move along a first extension direction of the first rail based on maintaining an electric connection with the first rail. In some examples, the first rail may include a pair of first rails configured to supply the electric current to the heating module, and the heating module may include a pair of contact terminals that are in contact with the pair of first rails, respectively.

In some examples, each of the pair of contact terminals may have an end portion that contacts an upper end of one of the pair of first rails, and a bent portion that allows the end portion to contact the upper end of the one of the pair of first rails. In some implementations, the bent portion may be configured to apply an elastic force to the end portion to thereby maintain contact between the end portion and the upper end of the one of the pair of first rails.

In some implementations, the rail may further include a second rail that extends in a second extension direction orthogonal to the first extension direction and that is electrically connected to the first rail, and the first rail may be configured to move along the second extension direction of the second rail while maintaining an electric connection with the second rail.

In some implementations, the cooking apparatus may further include a first moving tool configured to move the heating module along the first rail, and a second moving tool configured to move the first rail along the second rail. In some examples, the first moving tool and the second moving tool may be electrically connected to at least one of the first rail or the second rail and may be configured to receive the electric current from the at least one of the first rail or the second rail. For example, each of the first moving tool and the second moving tool may include at least one of a motor, a wheel, or a gear.

In some implementations, the cooking apparatus may further include a power supply that is electrically connected to the second rail and that is configured to supply the electric current to the second rail.

In some implementations, the heating module may further include an inverter that is configured to convert the electric current supplied through the rail into a high-frequency current and that is configured to supply the high-frequency current to the coil of the heating module. In some examples, the inverter may be disposed vertically below the coil, and the heating module may further include a magnetic field-blocking member that is disposed between the coil and the inverter and that is configured to shield the inverter from a magnetic field generated in the coil. For example, the magnetic field-blocking member may be or include an aluminum plate.

In some implementations, the inverter may be disposed vertically below the coil, and the heating module may further include a ferrite core that is disposed between the coil and the inverter. In some implementations, the electric current is an alternating current (AC).

In some implementations, the heating module may be spaced apart from a lower surface of the upper plate. In some examples, the rail may further include a pair of second rails that are connected to the pair of first rails, respectively, and that extend in a second extension direction orthogonal to the first extension direction. The pair of first rails may be configured to move along the pair of second rails.

In some examples, the pair of second rails are fixed at a predetermined position, and the heating module may be configured to move together with the pair of first rails along the pair of second rails in the second extension direction and to move along the pair of first rails in the first extension direction. In some examples, the pair of second rails may be connected to a power supply and configured to transmit electric power from the power supply to the pair of first rails.

In some implementations, the first moving tool may be coupled to the heating module and configured to move together with the heating module along the first rail, and the second moving tool may be coupled to the first rail and configured to move together with the first rail along the second rail.

DETAILED DESCRIPTION

Figure 1:
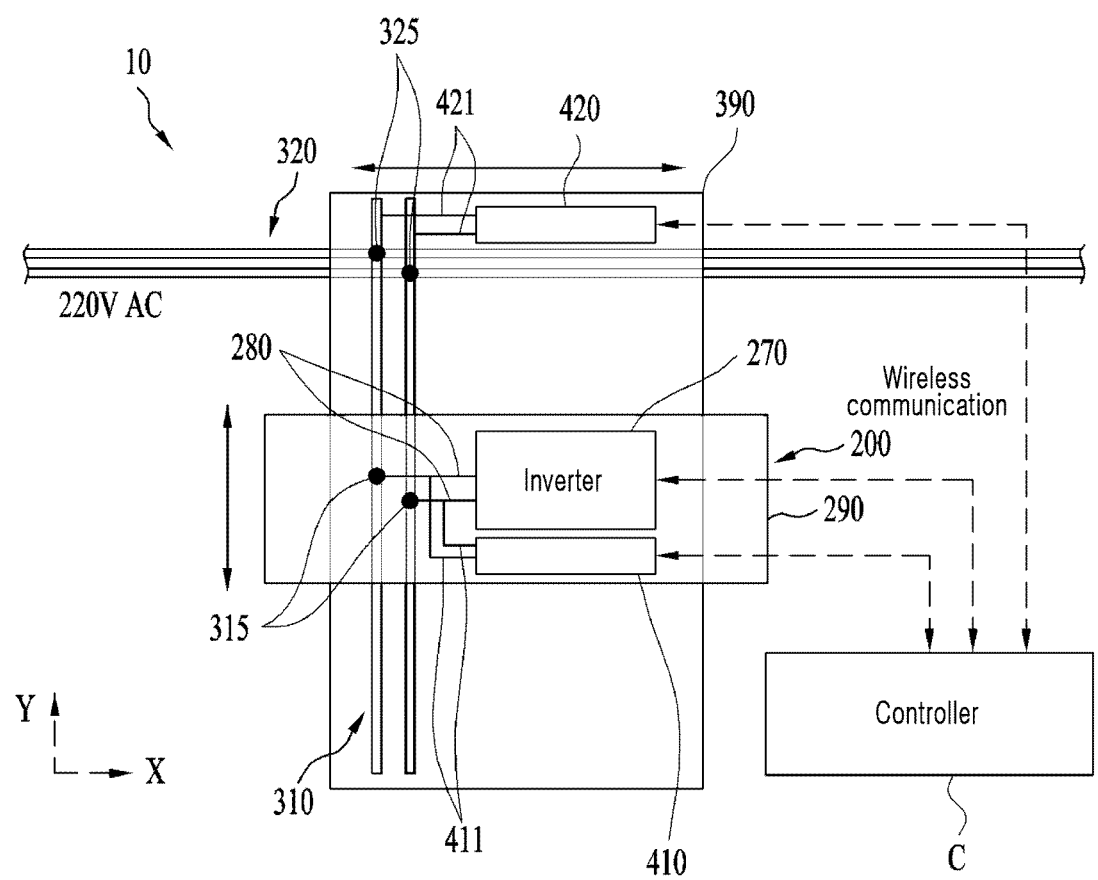
FIG. 1 is a conceptual view illustrating an example of a cooking apparatus.

One or more implementations of a cooking apparatus will be described below with reference to the accompanying drawings. The drawings illustrate examples of the present disclosure and are provided to describe the disclosure in detail. Thus, the technical scope of the present disclosure should not be construed as being limited to the implementations and drawings set forth herein.

Regardless of numbers of the drawings, like reference numerals denote like components, and description of like components is not repeated.

Figure 2:
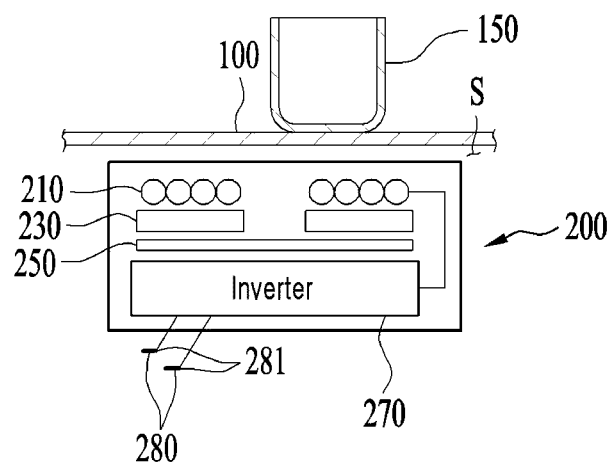
FIG. 2 is a view illustrating an example of a heating module of the cooking apparatus in FIG. 1.

FIG. 1 is a conceptual view illustrating an example of a cooking apparatus, and FIG. 2 is a view illustrating an example of a heating module of the cooking apparatus in FIG. 1.

Specifically, FIG. 1 is a schematic plane view illustrating a state in which an upper plate supporting a cooking vessel is omitted, and FIG. 2 is a schematic lateral cross-sectional view illustrating a heating module disposed in a lower space below the upper plate.

For convenience of description, an X-axis in FIG. 1 may indicate a lengthwise direction of a cooking apparatus, and a Y-axis in FIG. 1 may indicate a widthwise direction of the cooking apparatus.

Referring to FIGS. 1 and 2, a cooking apparatus 10 may include an induction range configured to heat a cooking vessel by a magnetic field that is generated by electric current supplied to a coil.

The cooking apparatus 10 may include a heating module 200 disposed under an upper plate 100, and rails 310, 320 disposed under the heating module 200.

In some implementations, the upper plate 100 may be made of at least one of glass, marble, ceramics, and wood. A cooking vessel 150 may be disposed on the upper plate 100. That is, the cooking vessel 150 may be supported by the upper plate 100.

In some examples, the cooking vessel may be made of a material that may be heated by a magnetic field generated in the heating module 200. For example, the cooking vessel 150 may be made of a material to which a magnet is attached (e.g., metal to which a magnet is attached).

The heating module 200 may be disposed in a space(S) provided under the upper plate 100. The heating module 200 may be movably provided in the space(S). For example, the heating module 200 may be movably provided in the space (S) in the lengthwise direction and the widthwise direction of the cooking apparatus.

The heating module 200 may include a coil 210. The coil 210 may be made of a material including copper. In some examples, the coil 210 may include a copper wire that is wound multiple times in a circular form. For example, the coil 210 may have a shape in which a copper wire is wound a plurality of times in different radial directions. In some examples, the coil 210 may have a shape in which a copper wire is wound a plurality of times such that a radius of the copper wire is gradually increased.

When electric current is supplied to the coil 210, a magnetic field may be generated. In some examples, the electric current may be alternating current. A cooking vessel 150 disposed above the coil 210 may be heated by the magnetic field generated in the coil 210.

The heating module 200 may further include an inverter 270 disposed under the coil 210. The inverter 270 may be configured to convert electric current supplied to the heating module 200 into high-frequency current. That is, electric current is supplied to the inverter 270 from an external power supply, and the inverter 270 may convert electric current supplied by the external power supply into high-frequency current and may supply the high-frequency current to the coil 210.

The inverter 270 may be provided at the heating module 200. When the heating module 200 moves, the invert 270 may also move. The inverter 270 may be controlled by a controller (C). For example, the inverter 270 may be controlled by the controller (C) through wireless communication.

In some examples, as the inverter 270 moves together with the coil 210 when the heating module 200 moves, an electric short circuit or an electric disconnection between the inverter 270 and the coil 210 may not occur while the heating module 200 moves.

The heating module 200 may further include a magnetic field-blocking member 250 disposed between the coil 210 and the inverter 270. That is, the coil 210, the magnetic field-blocking member 250 and the inverter 270 may be consecutively disposed in an up-down direction. The magnetic field-blocking member 250 may be configured to block a magnetic field generated in the coil 210 from proceeding to the inverter 270.

For example, the magnetic field-blocking member 250 may include an aluminum plate. The magnetic field-blocking member 250 may help to prevent the inverter 270 from operating incorrectly and from being damaged.

The heating module 200 may further include a ferrite core 230 disposed between the coil 210 and the inverter 270. The ferrite core 230 may be disposed between the coil 210 and the magnetic field-blocking member 250.

By the ferrite core 230, a path of a magnetic field generated in the coil 210 may concentrate on a cooking vessel 150 disposed above the coil 210. That is, the ferrite core 230 may concentrate a path of a magnetic field generated in the coil 210 on an upper side of the coil 210, and may magnify intensity of a magnetic field affecting a cooking vessel.

Referring to FIG. 1, the rails 310, 320 may be configured to guide movement of the heating module 200. The rails 310, 320 may be disposed under the heating module 200. For example, the rails 310, 320 may be disposed under the heating module 200 in a space(S) provided under the above-described top plate 100.

In some implementations, electric current from an external power supply may be supplied to the rails 310, 320. For example, the rails 310, 320 may be made of electrically conductive metal. In some examples, the heating module 200 may be supplied with electric current through the rails 310, 320. Accordingly, while the heating module 200 moves in the space(S), a short circuit may not occur between the rails 310, 320 and the heating module 200.

The heating module 200 may be disposed on the rails 310, 320, and the rails 310, 320 may include a first rail 310 electrically connected to the heating module 200. The first rail 310 may be configured to have a predetermined length such that the first rail extends in the widthwise direction (i.e., the Y-axis direction) of the cooking apparatus 10.

The heating module 200 may move on the first rail 310 along extension direction of the first rail 310. When the heating module 200 moves on the first rail 310, an electric connection between the first rail 310 and the heating module 200 may be maintained.

In some examples, regardless of a position of the heating module 200 on the first rail 310, the heating module 200 may be supplied with electric current from an external power supply through the first rail 310.

In some implementations, a pair of first rails 310 may be provided to supply alternating current to the heating module 200. For example, the pair of first rails 310 may extend in the widthwise direction of the cooking apparatus 10 in parallel with each other.

In some implementations, the heating module 200 may include a contact terminal 280 that keeps contacting the first rail 310. For example, the pair of contact terminals 280 may be provided to correspond to the pair of first rails 310. Through the pair of first rails 310 and the pair of contact terminals 280, alternating current may be supplied to the heating module 200.

For example, the pair of first rails 310 and the pair of contact terminals 280 may contact each other at a pair of first contact areas 315. Positions of the pair of first contact areas 315 may vary depending on movement of the heating module 200 on the first rail 310.

One end of the contact terminal 280 may be connected to the inverter 270, and the other end (i.e., a free end) of the contact terminal 280 may contact the first rail 310. Accordingly, electric current from an external power supply may consecutively pass the first rail 310, the contact terminal 280 and the inverter 270 and then may be supplied to the coil 210.

Figure 3:
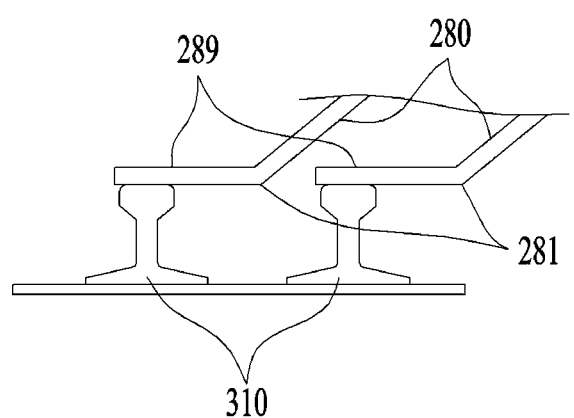
FIG. 3 is a view illustrating an example of an electric connection between a rail and a coil of a heating module.

FIG. 3 is a cross-sectional view illustrating an example of an electric connection between a rail and a coil provided at a heating module.

Referring to FIGS. 1 and 3, a pair of first rails 310 may be spaced apart from each other and may be disposed in parallel with each other. The first rail 310 may have a shape in which a surface area of its upper end is smaller than a surface area of its lower end, and the contact terminal 280 may contact the upper end. Accordingly, a short may not occur between the first rail 310 and the contact terminal 280.

The first rail 310 and the inverter 270 may be electrically connected by the contact terminal 280.

In some examples, the free end 289 of the contact terminal 280 may contact the upper end of the first rail 310. In some examples, the contact terminal 280 may include a bent portion 281 such that the free end 289 elastically contacts the upper end of the first rail 310.

That is, the bent portion 281 is formed at the first rail 310 and the free end of the first rail 310 may elastically contact the upper end of the first rail 310. The bent portion 281 may be disposed closer to the other end of the contact terminal 280 than to one end of the contact terminal 280. In other words, the bent portion 281 may be disposed near the free end 289 of the contact terminal 280.

Accordingly, the free end of the contact terminal 280 may be pressed downwards on the first rail 310 against the first rail 310, and a contact force between the first rail 310 and the contact terminal 280 may be increased.

Referring back to FIGS. 1 and 2, the rails 310, 320 may further include a second rail 320 that is orthogonal to the first rail 310. The second rail 320 may be electrically connected to the first rail 310.

The first rail 310 may move along extension direction of the second rail 320 while maintaining the electric connection with the second rail 320. That is, the second rail 320 may be configured to extend in a predetermined length in the lengthwise direction (i.e., the X-axis direction) of the cooking apparatus 10.

In some examples, the first rail 310 may be configured to move on the second rail 320 along extension direction of the second rail 320. In some examples, although the first rail 310 is moved on the second rail 320, the electric connection between the first rail 310 and the second rail 320 may be maintained.

In some implementations, a pair of second rails 320 may be provided to correspond to the pair of first rails 310. The pair of first rails 310 and the pair of second rails 320 may contact each other at a pair of second contact areas 325. Positions of the pair of second contact areas 325 may vary depending on movements of the first rail 310 on the second rail 320.

When electric current is supplied to any one of the first rail 310 and the second rail 320 from an external power supply, the electric current may also be supplied to the other rail. That is, as the first rail 310 and the second rail 320 are electrically connected, a degree of freedom of an electric connection through the external power supply may be increased.

In some implementations, the external power supply may be electrically connected to the second rail 320, and the first rail 310 may receive electric current through the second rail 320, as the first rail 310 may move on the second rail 320 along extension direction of the second rail 320.

In some implementations, the first rail 310 may move relative to the second rail 320, and the second rail 320 may be fixed to a predetermined position. For example, the second rail 320 may be disposed at one side in the widthwise direction of the space(S).

When an external power supply is connected to the movable first rail 310 directly and electrically, an electric short circuit or an electric disconnection may occur between the external power supply and the first rail 310. In some examples, an external power supply is connected to the fixed second rail 320, and the first rail 310 is supplied with electric current through the second rail 320.

That is, as the external power supply may be connected to the second rail 320 directly and electrically, the electric current from the external power supply may pass the second rail 320, the first rail 310, the contact terminal 280, and the inverter 270 consecutively, and then may be supplied to the coil 210.

In some implementations, the cooking apparatus 10 may further include one or more drivers or driving devices. For example, the cooking apparatus 10 may further include one or more moving tools 410, 420 for moving the heating module 200. In some examples, the moving tools 410, 420 may include at least one of a wheel, a motor, a gear, and a hydraulic cylinder, and the like, or any combinations thereof.

The moving tools 410, 420 may include a first moving tool 410 for moving the heating module 200 on the first rail 310, and a second moving tool 420 for moving the second rail 320 on the second rail 320.

The first moving tool 410 may be configured to supply power for moving the heating module 200 on the first rail 310. Additionally, the second moving tool 420 may be configured to supply power for moving the second rail 320 on the second rail 320.

In some implementations, the first moving tool 410 may be provided at the heating module 200 or may be spaced apart from the heating module 200. In some examples, the first moving tool 410 is provided at the heating module 200 to avoid interference when the heating module 200 moves.

In some examples, the second moving tool 420 is also disposed at a position where interference may be minimized when the heating module 200 moves. The second moving tool 420 may be disposed at one side of the second rail 320.

For example, the second rail 320 and the second moving tool 420 may all be disposed at one side of the cooking apparatus 10 in the widthwise direction thereof. Additionally, the second moving tool 420 may be disposed to lean further towards at one side of the cooking apparatus 10 in the widthwise direction thereof than the second rail 320. Accordingly, interference between the second moving tool 420 and the heating module 200 may be avoided.

The heating module 200 may be disposed on a first support bracket 290. The first support bracket 290 may have a length greater than a width and may be disposed on a second support bracket 390 at which the first rail 310 is disposed. The second support bracket 390 may extend along extension direction of the first rail 310. The second support bracket 390 may have a width greater than a length.

The first support bracket 290 may make relative movements with respect to the second support bracket 390 by the first moving tool 410. That is, the first support bracket 290 may be moved along extension direction of the second support bracket 390 by the first moving tool 410. For example, the first support bracket 290 may be slid on the second support bracket 390 by the first moving tool 410.

The second support bracket 390 may make relative movements with respect to the second rail 320 by the second moving tool 420. That is, the second support bracket 390 may be moved along extension direction of the second rail 320 by the second moving tool 420. For example, the second rail 320 may be disposed at a bottom surface of the space(S) provided under the above-described top plate 100, and the second support bracket 390 may be slid on the second rail 320 by the second moving tool 420.

The first rail 310 and the second moving tool 420 may be disposed at the second support bracket 390. Additionally, the second rail 320 may be disposed to cross the second support bracket 390 in the lengthwise direction (the X-axis direction) under the second support bracket 390.

The moving tools 410, 420 may be supplied with electric current through at least one of the first rail 310 and the second rail 320. For example, the first moving tool 410 and the second moving tool 420 may be electrically connected with the first rail 310 or the second rail 320 and may be supplied with electric current. Accordingly, a wire for supplying electric current to the first rail 310 and the second rail 320 may be simply implemented.

In some implementations, the first moving tool 410 and the second moving tool 420 may all be supplied with electric current through the first rail 310.

Specifically, a first connection wire 411 may be provided between the first moving tool 410 and the contact terminal 280, and the first moving tool 410 may be supplied with electric current through the first connection wire 411.

A second connection wire 421 may be provided between the second moving tool 420 and the first rail 310, and the second moving tool 420 may be supplied with electric current through the second connection wire 421.

For example, the second connection wire 421 may be disposed to connect one end of the first rail 310 in a lengthwise direction thereof and the second moving tool 420. One end of the first rail 310 in the lengthwise direction thereof may be one of both ends of the first rail 310 in the lengthwise direction thereof, which is relatively close to the second moving tool 420.

Through the arrangement of the first connection wire 411 and the second connection wire 421, interference with the heating module 200 may be avoided, and, using a minimum length of the connection wire, electric current may be supplied to the first moving tool 410 and the second moving tool 420.

An example of an electric connection between main components provided at the cooking apparatus 10 is described below with reference to another drawing.

Figure 4:
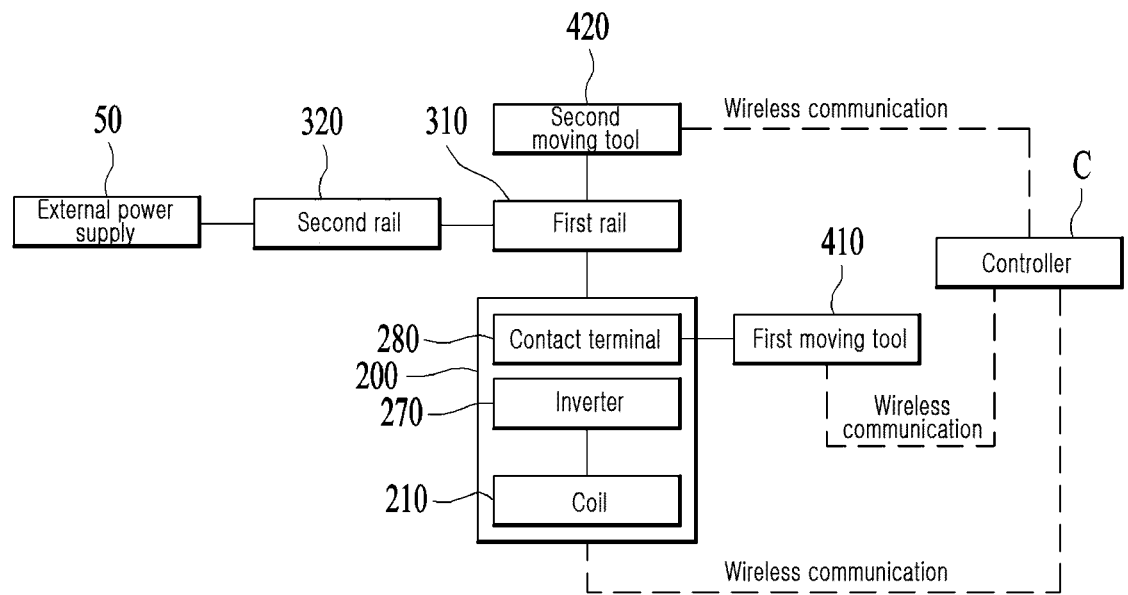
FIG. 4 is a view illustrating an example of a connection between example components.

FIG. 4 is a view illustrating an example of a connection between example components.

Referring to FIG. 4, the second rail 320 may be electrically connected to an external power supply 50. That is, the second rail 320 may be connected to the external power supply 50 directly and electrically.

The second rail 320 may be electrically connected to the first rail 310. Accordingly, electric current from the external power supply 50 may be supplied to the first rail 310 through the second rail 320.

The first rail 310 may be electrically connected respectively to the heating module 200, the first moving tool 410 and the second moving tool 420.

In some examples, the first rail 310 and the second moving tool 420 may be connected directly and electrically. The first rail 310 and the heating module 200 may also be connected directly and electrically.

In some implementations, the first rail 310 and the first moving tool 410 may be electrically connected through the contact terminal 280 provided at the heating module 200.

The heating module 200, the first moving tool 410 and the second moving tool 420 may be controlled by the controller (C). For example, the heating module 200, the first moving tool 410 and the second moving tool 420 may communicate with the controller (C) using a wireless communication method.

In some implementations, the heating module 200, the first moving tool 410, and the second moving tool 420 may be provided respectively with a communication module to communicate with the controller (C), and the controller (C) may also include a communication module. In some cases, the controller (C) may include an electric circuit, a transmitter, a receiver, or processor.

The heating module 200, the first moving tool 410 and the second moving tool 420 may be controlled by the controller (C) through wireless communication. Accordingly, interference between the heating module 200 and a communication wire caused by movements of the heating module 200 may be avoided through control by the controller using wireless communication better than through control by the controller using the communication wire.

Electric current from the external power supply 50, as described above, may pass the second rail 320 and the first rail 310 consecutively and may be respectively supplied to the second moving tool 420 and the heating module 200. Further, electric current supplied to the heating module 200 may be supplied to the first moving tool 410 through the contact terminal 280 provided at the heating module 200.

The cooking apparatus of the present disclosure, as described above, may heat a cooking vessel through a change in a position of a single heating module even when the cooking vessel is disposed at any position on the cooking apparatus.

The cooking apparatus of the present disclosure may supply electric current stably to the heating module without interruption of supply of current or disconnection of current even when the heating module provided at the cooking apparatus is moved.

The present disclosure has been described with reference to the one or more implementations illustrated in the drawings. Further, the disclosure may be modified in various different forms by one having ordinary skill in the art to which the disclosure pertains within the technical spirit and scope of the disclosure defined in the appended claims. Thus, modifications made to the implementations of the disclosure should be included in the present disclosure.

The invention claimed is:

1. A cooking apparatus, comprising:
an upper plate configured to support a cooking vessel;
a heating module that is disposed in a lower space defined vertically below the upper plate and that is configured to move in the lower space relative to the upper plate, the heating module comprising a coil;
a first moving tool configured to move the heating module; and
a rail that is disposed vertically below the heating module, that is configured to guide movement of the heating module, and that is configured to receive electric current and transmit the electric current to the heating module and the first moving tool,
wherein the electric current is an alternating current (AC).

2. The cooking apparatus of claim 1, wherein the rail includes a first rail that supports the heating module and that is electrically connected to the heating module, and
wherein the heating module is configured to move along a first extension direction of the first rail based on maintaining an electric connection with the first rail.

3. The cooking apparatus of claim 2, wherein the first rail includes a pair of first rails configured to supply the electric current to the heating module, and
wherein the heating module includes a pair of contact terminals that are in contact with the pair of first rails, respectively.

4. The cooking apparatus of claim 3, wherein each of the pair of contact terminals has:
end portion that contacts an upper end of one of the pair of first rails; and
a bent portion that allows the end portion to contact the upper end of the one of the pair of first rails.

5. The cooking apparatus of claim 2, wherein the rail further includes a second rail that extends in a second extension direction orthogonal to the first extension direction and that is electrically connected to the first rail, and
wherein the first rail is configured to move along the second extension direction of the second rail while maintaining an electric connection with the second rail.

6. The cooking apparatus of claim 5,
wherein the first moving tool is configured to move the heating module along the first rail, and
wherein the cooking apparatus further comprises a second moving tool configured to move the first rail along the second rail.

7. The cooking apparatus of claim 6, wherein the first moving tool and the second moving tool are electrically connected to at least one of the first rail or the second rail and are configured to receive the electric current from the at least one of the first rail or the second rail.

8. The cooking apparatus of claim 5, further comprising:
a power supply that is electrically connected to the second rail and that is configured to supply the electric current to the second rail.

9. The cooking apparatus of claim 1, wherein the heating module further includes an inverter that is configured to convert the electric current supplied through the rail into a high-frequency current and that is configured to supply the high-frequency current to the coil of the heating module.

10. The cooking apparatus of claim 9, wherein the inverter is disposed vertically below the coil, and
wherein the heating module further includes a magnetic field-blocking member that is disposed between the coil and the inverter and that is configured to shield the inverter from a magnetic field generated in the coil.

11. The cooking apparatus of claim 10, wherein the magnetic field-blocking member includes an aluminum plate.

12. The cooking apparatus of claim 9, wherein the inverter is disposed vertically below the coil, and
wherein the heating module further includes a ferrite core that is disposed between the coil and the inverter.

13. The cooking apparatus of claim 1, wherein the heating module is spaced apart from a lower surface of the upper plate.

14. The cooking apparatus of claim 3, wherein the rail further includes a pair of second rails that are connected to the pair of first rails, respectively, and that extend in a second extension direction orthogonal to the first extension direction, and
wherein the pair of first rails are configured to move along the pair of second rails.

15. The cooking apparatus of claim 14, wherein the pair of second rails are fixed at a predetermined position, and
wherein the heating module is configured to move together with the pair of first rails along the pair of second rails in the second extension direction and to move along the pair of first rails in the first extension direction.

16. The cooking apparatus of claim 14, wherein the pair of second rails are connected to a power supply and configured to transmit electric power from the power supply to the pair of first rails.

17. The cooking apparatus of claim 6, wherein each of the first moving tool and the second moving tool includes at least one of a motor, a wheel, or a gear.

18. The cooking apparatus of claim 17, wherein the first moving tool is coupled to the heating module and configured to move together with the heating module along the first rail, and
wherein the second moving tool is coupled to the first rail and configured to move together with the first rail along the second rail.

19. The cooking apparatus of claim 4, wherein the bent portion is configured to apply an elastic force to the end portion to thereby maintain contact between the end portion and the upper end of the one of the pair of first rails.

* * * * *